(12) United States Patent
Gyoten et al.

(10) Patent No.: US 6,492,773 B2
(45) Date of Patent: Dec. 10, 2002

(54) SELF-BALLASTED FLUORESCENT LAMP

(75) Inventors: Masayoshi Gyoten, Shiga (JP); Koji Miyazaki, Osaka (JP); Kenichiro Takahashi, Osaka (JP); Satoshi Kominami, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/881,327

(22) Filed: Jun. 14, 2001

(65) Prior Publication Data

US 2002/0033678 A1 Mar. 21, 2002

(30) Foreign Application Priority Data

Jun. 19, 2000  (JP) ........................................ 2000-182644

(51) Int. Cl.$^7$ ................................................. H01J 17/34
(52) U.S. Cl. ............................ 315/56; 315/58; 313/634; 362/260
(58) Field of Search .............................. 315/56, 58, 55, 315/35, DIG. 4, 50, 51; 313/493, 634; 362/295, 260

(56) References Cited

U.S. PATENT DOCUMENTS

| | | | | | |
|---|---|---|---|---|---|
| 4,503,360 | A | * | 3/1985 | Bedel | 313/19 |
| 5,381,073 | A | * | 1/1995 | Godyak et al. | 313/493 |
| 5,545,950 | A | * | 8/1996 | Cho | 313/318.01 |
| 5,691,598 | A | * | 11/1997 | Belle et al. | 313/43 |
| 5,961,204 | A | * | 10/1999 | Martich et al. | 362/260 |

FOREIGN PATENT DOCUMENTS

| | | |
|---|---|---|
| EP | 918 352 | 5/1999 |
| JP | 2000-21351 | 1/2000 |

\* cited by examiner

*Primary Examiner*—Don Wong
*Assistant Examiner*—Ephrem Alemu
(74) *Attorney, Agent, or Firm*—Merchant & Gould P.C.

(57) ABSTRACT

A fluorescent lamp apparatus includes a fluorescent tube, a ballast circuit for lighting the fluorescent tube, a case for housing the ballast circuit and a holder provided at the end of the case for holding the fluorescent tube. The ballast circuit includes at least a first circuit board and a second circuit board, and the first and second circuit boards are arranged substantially perpendicular to each other in the case. This configuration can suppress an increase in the size of the apparatus and prevent thermal damage to the circuit elements during lamp operation.

6 Claims, 4 Drawing Sheets

SELF-BALLASTED FLUORESCENT LAMP

BACKGROUND OF THE INVENTION

1. Field of the Invention

The present invention relates to a self-ballasted fluorescent lamp, particularly, to an improvement in the arrangement of circuit boards that constitute a ballast circuit.

2. Description of the Related Art

As a conventional fluorescent lamp apparatus, e.g., a bulb-shaped fluorescent lamp has been known, including a fluorescent tube, a ballast circuit for lighting the fluorescent tube, and a case (cover) for housing the ballast circuit. JP 2000-21351 A discloses such a bulb-shaped fluorescent lamp, where a circuit board of a ballast circuit is divided into two parts and the two circuit boards are arranged in parallel to each other, so that the area of the ballast circuit is small and the size of circuit-mounted structure is reduced. Those two circuit boards are connected electrically by a cable or the like.

In the conventional bulb-shaped fluorescent lamp, the number of electronic components (hereinafter, referred to as circuit elements) required for electronic lighting is generally about 30 to 40.

In recent years, it has been desired to apply the conventional bulb-shaped fluorescent lamp to a dimmable lighting fixture. For this reason, a ballast circuit having a dimming function has been proposed, which is formed by adding the circuit elements for dimming to a conventional ballast circuit.

However, in the ballast circuit having a dimming function, the number of circuit elements is increased from two to four times that of the conventional ballast circuit by the addition of the circuit elements for dimming. Therefore, the circuit board becomes large, which in turn increases the size of the case that houses the circuit board. Consequently, the lamp apparatus itself becomes large as well.

Moreover, the dimming circuit elements to be added include circuit elements that are easily damaged by heat. Thus, those circuit elements are damaged by heat radiated from the fluorescent tube during lamp operation, making the lifetime shorter than that of the conventional lamp.

SUMMARY OF THE INVENTION

Therefore, with the foregoing in mind, it is an object of the present invention to provide a fluorescent lamp apparatus with longer lifetime that can suppress an increase in the size of a case for housing a ballast circuit, i.e., a lamp apparatus, and prevent the thermal damage to circuit elements during lamp operation, even if the number of the circuit elements is increased like a ballast circuit having a dimming function.

A fluorescent lamp apparatus of the present invention includes a fluorescent tube, a ballast circuit for lighting the fluorescent tube, a case for housing the ballast circuit, and a holder provided at the end of the case for holding the fluorescent tube. The ballast circuit includes at least a first circuit board and a second circuit board, and the second circuit board is arranged to be substantially perpendicular to the first circuit board.

This enables the effective utilization of space in the case when the ballast circuit is housed therein. Thus, even if the number of circuit elements is increased, the above configuration can suppress an increase in the case size. In addition, the circuit elements that are affected easily by heat can be separated from the fluorescent tube.

It is preferable that the first circuit board is arranged between the holder and the second circuit board so as to be substantially perpendicular to the central axis of the case.

It is preferable that the second circuit board is arranged so that a portion of its periphery comes into contact with the first circuit board.

It is preferable that the width of the second circuit board is reduced in the direction opposite to the fluorescent tube.

It is preferable that the second circuit board is displaced from the central axis of the case.

It is preferable that circuit elements that generate heat by electrical loss are mounted on the first circuit board, while circuit elements that are affected easily by heat are mounted on the surface of the second circuit board that does not face the circuit elements generating heat by electrical loss.

DESCRIPTION OF THE PREFERRED EMBODIMENTS

Hereinafter, an embodiment of the present invention will be described with reference to the accompanying drawings.

Figure 1:
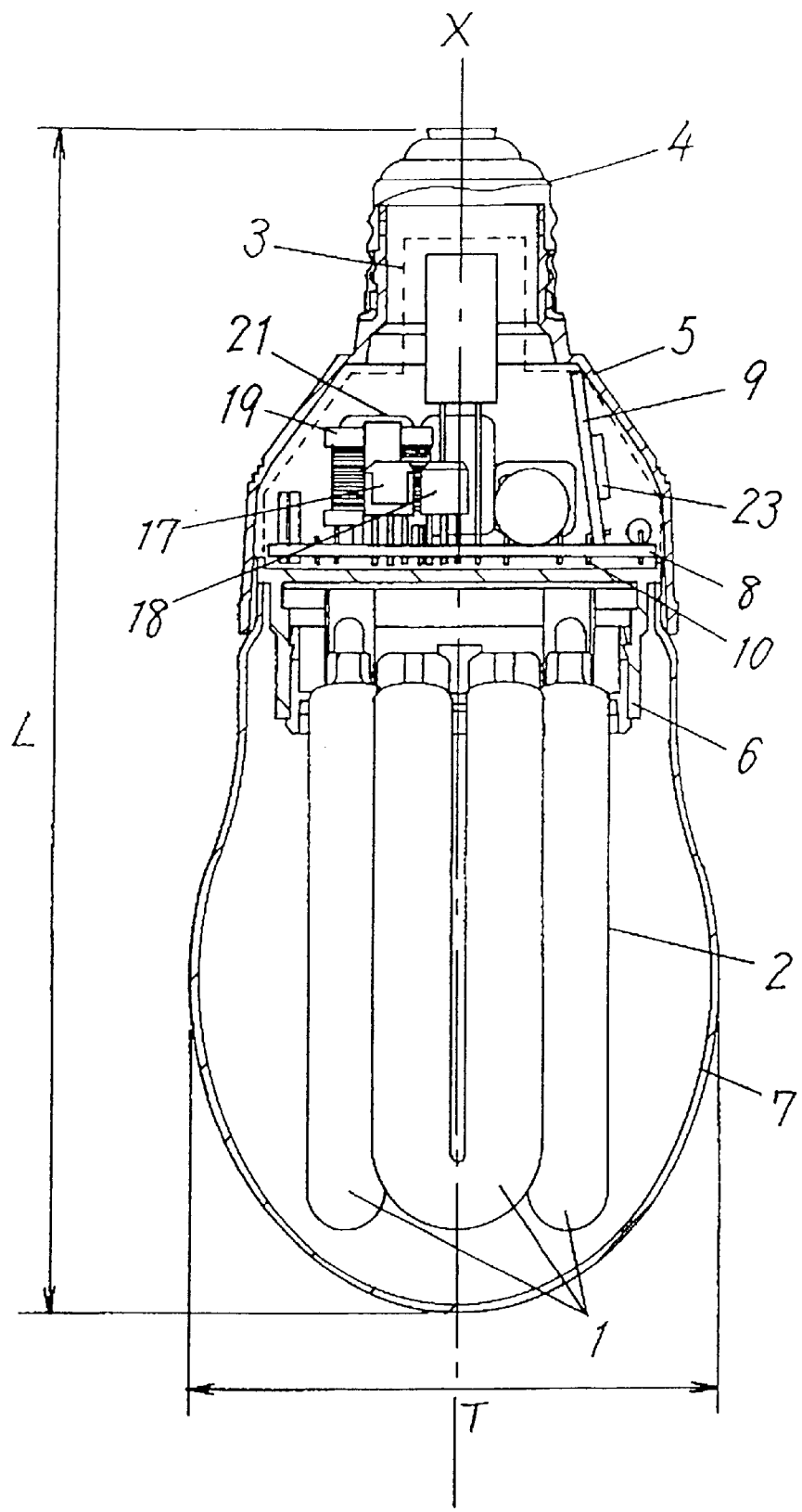
FIG. 1 is a partially cutaway front view of a bulb-shaped fluorescent lamp having a dimming function according to an embodiment of the present invention.
Figure 2:
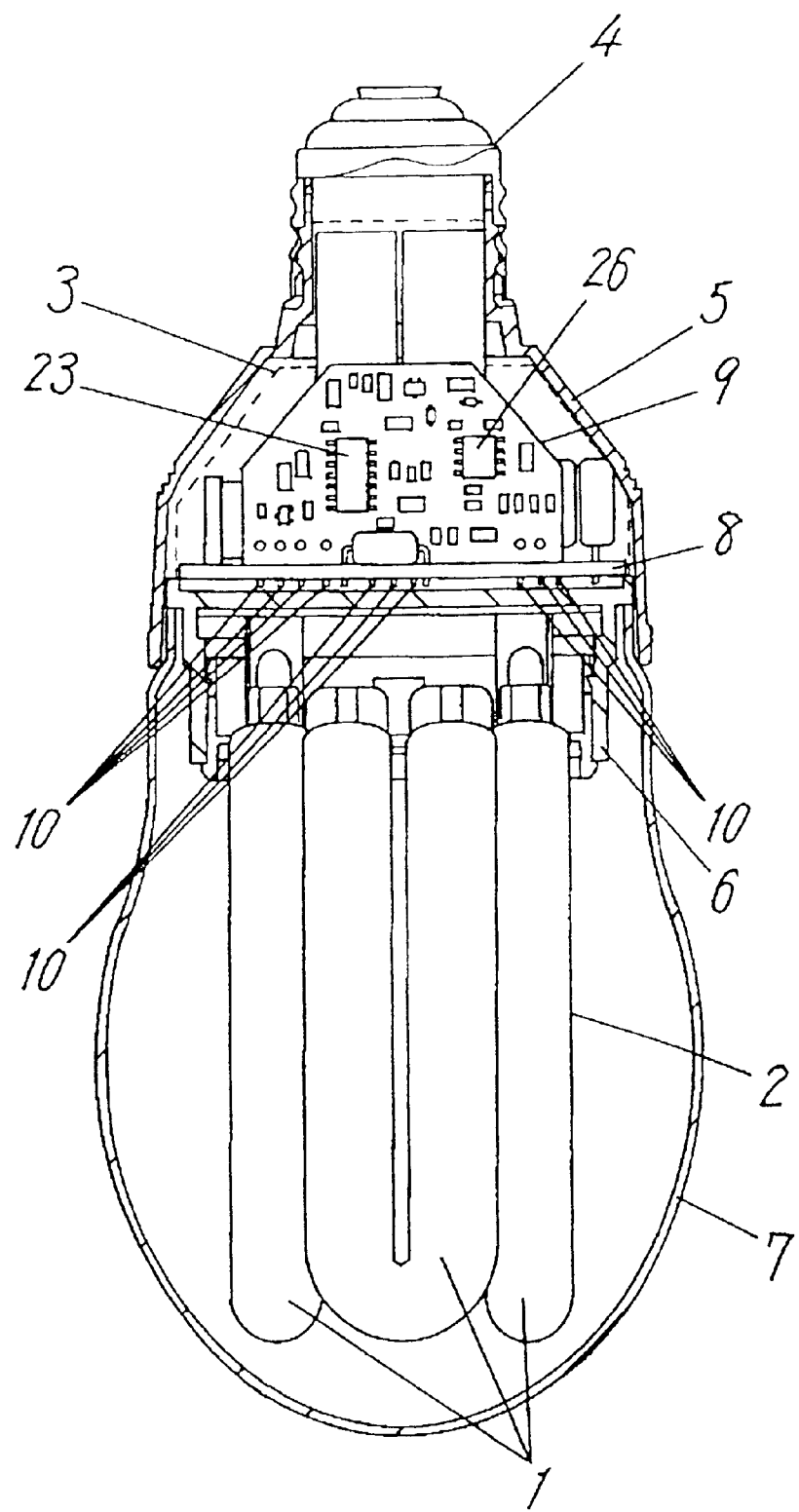
FIG. 2 is a partially cutaway side view of the bulb-shaped fluorescent lamp having a dimming function in FIG. 1.

As an example of this embodiment, the present invention is applied to a bulb-shaped fluorescent lamp having a dimming function, a rated power of 22 W, total length L of 158 mm, and maximum diameter T of 73 mm. The fluorescent lamp, as shown in FIGS. 1 and 2, has a fluorescent tube 2 that includes four U-shaped glass bulbs 1, three of which are illustrated. The glass bulbs 1 (having an outer diameter of 11 mm) are joined at bridge junctions to form a discharge path inside the fluorescent tube 2. A ballast circuit 3 (enclosed by broken lines) for lighting the fluorescent tube 2 is housed in a case 5, which has a base 4 at one end. A holder 6, provided at the other end of the case 5, holds the fluorescent tube 2 and the ballast circuit 3, which are opposed to each other. A transparent globe 7 covers the fluorescent tube 2.

The fluorescent tube 2 has electrodes (not shown) at both ends. The distance between the electrodes is 378 mm. Also, a coating of phosphor (not shown) is applied to the inner surface of the fluorescent tube 2. The fluorescent tube 2 is filled with a predetermined amount of mercury or amalgam and of rare gas.

Figure 3:
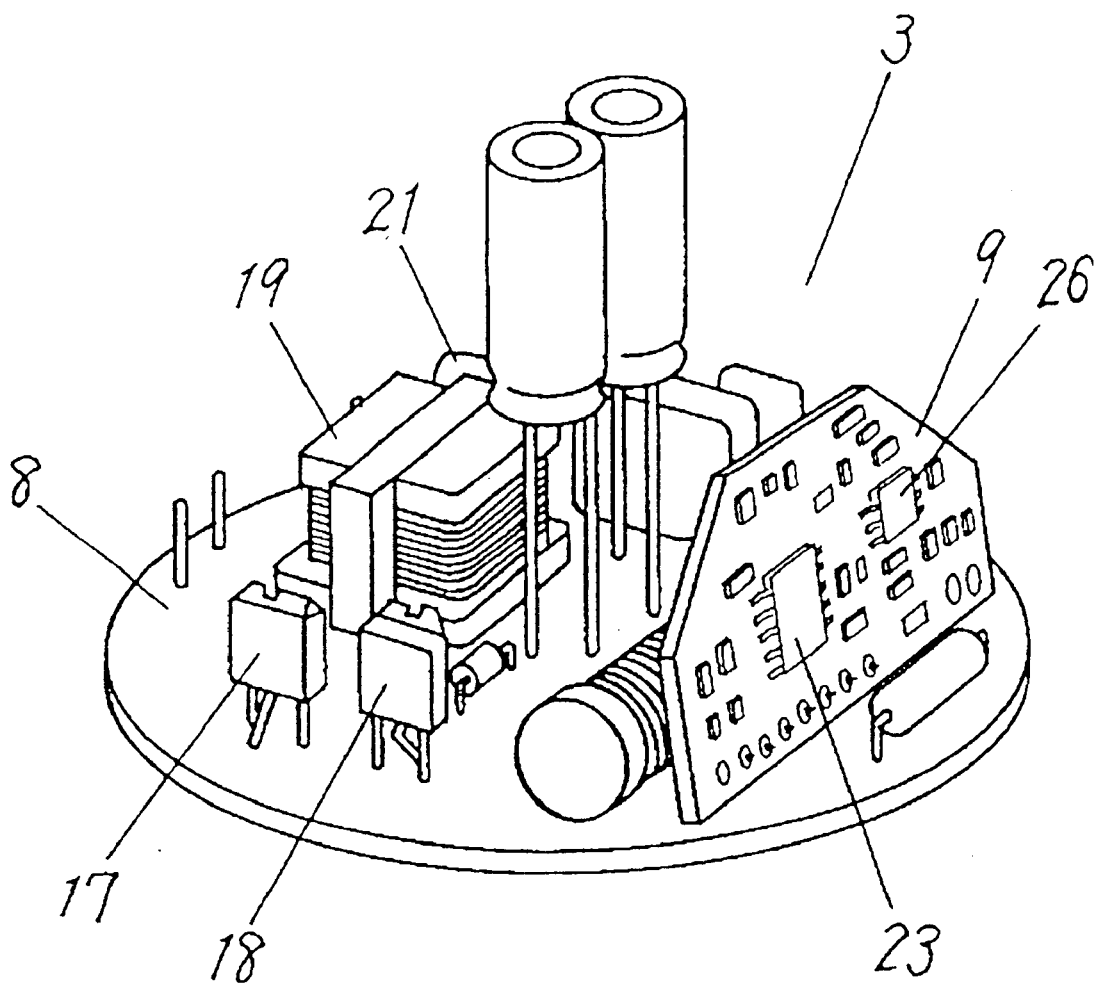
FIG. 3 is a perspective view of a ballast circuit used in the bulb-shaped fluorescent lamp having a dimming function in FIG. 1.

As shown in FIGS. 1 to 3, the ballast circuit 3 includes a first circuit board 8 and a second circuit board 9 that are made, e.g., of paper phenol resin or glass epoxy resin.

The first circuit board 8 is in the form of a disk having a maximum diameter of 56 mm and is placed horizontally on the surface of the holder 6 opposite to the fluorescent tube 2. In other words, the first circuit board 8 is arranged to be perpendicular to the central axis X of the case 5. The base 4 and the first circuit board 8 are connected through a lead wire (not shown).

The second circuit board 9 is in the form of a hexagonal plate having a maximum width of 39 mm, minimum width of 12 mm, and length of 23 mm. The second circuit board 9 is placed on the surface of the first circuit board 8 opposite to the fluorescent tube 2 so as to be substantially perpendicular to the first circuit board 8, with the longer width side facing the first circuit board 8. In other words, the second circuit board 9 is arranged in such a manner that the width thereof is reduced in the direction opposite to the fluorescent tube 2. It is preferable that the angle between the first circuit board 8 and the second circuit board 9 is about 60° to 120°, in order to protect the circuit elements against heat radiated from the fluorescent tube 2 due to a location too close to the fluorescent tube 2.

Moreover, to suppress a rise in the temperature of the circuit elements and to prevent thermal damage to them, the second circuit board 9 is displaced from the central axis X of the case 5. The reason for this is as follows: among the circuit elements, the elements that generate heat by electrical loss, such as switching devices 17, 18, an inductor 19, and capacitors 20, 21 (only the capacitor 21 is shown in FIG. 1), cause heat radiation to increase the temperature of the case 5 near the central axis X; it has been confirmed that the greater the distance from the central axis X is, the lower the temperature becomes.

In addition, a portion of the periphery of the second circuit board 9, i.e., the edge of the second circuit board 9 with a larger width, is in contact with the first circuit board 8. This allows the first and second circuit boards 8, 9 to be connected electrically, e.g., using an integral connector 10 including ten terminals. Therefore, the connection between the first and second circuit boards 8, 9 is established easily with a simple structure, compared with the connection conventionally made by a cable or the like.

About 90 circuit elements in total, including those for dimming, are mounted on both sides or one side of each of the first and second circuit boards 8, 9, though not all of them are shown.

In particular, the circuit elements that generate heat by electrical loss, e.g., the inductor 19 for suppressing current through the fluorescent tube 2 and producing the largest amount of heat, are mounted on the surface of the first circuit board 8 opposite to the fluorescent tube 2. The circuit elements that are affected easily by heat, e.g., an inverter controller IC 23 and operation amplifier 26, are mounted on the surface of the second circuit board 9 that does not face the inductor 19, i.e., the position located as far as possible from the heat source. Consequently, the heat-sensitive circuit elements can be separated further from the circuit elements that generate heat by electrical loss than those in a conventional lamp. This can protect the heat-sensitive circuit elements from destruction due to thermal damage.

The case 5 is made of polybutylene terephthalate (PBT) resin or the like and is in the form of a funnel having a total length of 43 mm and maximum diameter of 61 mm, as shown in FIGS. 1 and 2. The case 5 is connected to the transparent globe 7 with an adhesive (not shown).

Figure 4:
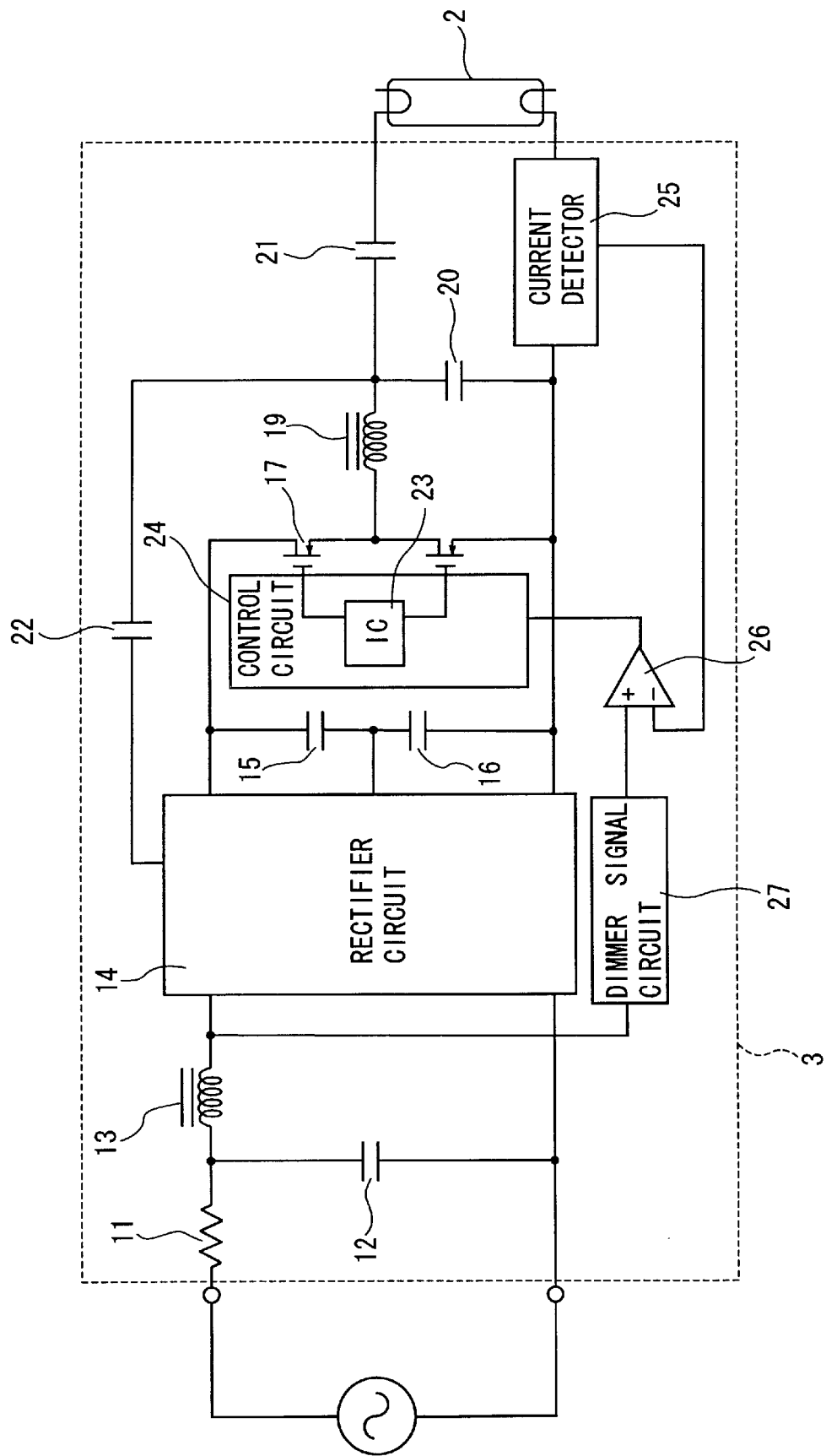
FIG. 4 is a circuit diagram of a ballast circuit used in the bulb-shaped fluorescent lamp having a dimming function in FIG. 1.

Next, the operation of the ballast circuit 3 will be described with reference to FIG. 4. FIG. 4 shows the circuit structure of the ballast circuit 3.

Power is supplied from a commercial power source to a rectifier circuit 14 via a resistor 11 for preventing inrush current and a noise filter including a capacitor 12 and an inductor 13. The rectifier circuit 14 converts the power to a DC voltage to charge smoothing capacitors 15, 16. The charged voltage is converted to a high frequency voltage by switching devices 17, 18, which then is supplied to a fluorescent tube 2 via a resonant circuit and a capacitor 21 for interrupting the direct current. The resonant circuit includes an inductor 19 and a capacitor 20.

The high frequency voltage of the capacitor 20 is fed back to the rectifier circuit 14 by a capacitor 22, so that the power factor of the input current supplied to the ballast circuit 3 can be improved.

The switching devices 17, 18 are controlled to alternate between on and off by a control circuit 24 including an inverter controller IC 23.

The current flowing through the fluorescent tube 2 is detected by a current detector 25 and then compared with a set level by an operation amplifier 26. As a result of the comparison, the output signal from the operation amplifier 26 is fed back to the control circuit 24 so as to control frequency. Thus, the current through the fluorescent tube 2 can be controlled. Therefore, dimming can be achieved by changing the set level that is input to the operation amplifier 26 with a dimmer signal circuit 27. The operation of dimming will be described below.

In the ballast circuit 3, when a dimmer (not shown) for a general incandescent lamp is connected between the commercial power source and the ballast circuit 3, a supply voltage to be input to the ballast circuit 3 is variable. According to such a change in the supply voltage, the output voltage of the dimmer signal circuit 27 is variable. Then, the operation amplifier 26 compares the signal from the dimmer signal circuit 27 with that from the current detector 25, and thus dimming can be performed. Therefore, operating the dimmer for an incandescent lamp makes dimming possible.

The following is the outcome of the evaluation of size and characteristics of a bulb-shaped fluorescent lamp having a dimming function according to this embodiment (hereinafter, referred to as a lamp of the invention).

Table 1 compares the lamp of the invention with a conventional bulb-shaped fluorescent lamp (hereinafter, referred to as a conventional lamp) in terms of the sizes of lamp and case. The conventional lamp does not have a dimming function and includes one circuit board that is arranged to be perpendicular to the central axis of a case. Table 1 also shows the result of the test on the lifetime of the lamp of the invention and the conventional lamp. The lifetime indicates the time elapsing from the beginning of lighting to a lamp state where lighting is impossible.

TABLE 1

| | | Lamp of the invention | Conventional lamp |
|---|---|---|---|
| Number of circuit elements | | about 90 | about 30 |
| Lamp size | Total length | 158 mm | 149 mm |
| | Maximum diameter | 73 mm | 70 mm |
| Case size | Total length | 43 mm | 36 mm |
| | Maximum diameter | 61 mm | 70 mm |
| Lifetime | | 6000 h | 6000 h |

As can be seen from Table 1, the size of the lamp of the invention is substantially the same as that of the conventional lamp, although the number of circuit elements is increased to three times that of the conventional lamp by addition of the circuit elements for dimming.

Moreover, despite the use of the heat-sensitive circuit elements, the lifetime of the lamp of the invention is the same as that of the conventional lamp. The reason for this is considered to be as follows: the heat-sensitive circuit elements can be protected against heat radiated from the fluorescent tube 2 by keeping those elements away from the fluorescent tube 2.

In fact, the study shows that temperature of the inverter controller IC 23 or operation amplifier 26 during lamp operation was 115° C., which was below the maximum rated temperature (125° C.).

As described above, a fluorescent lamp apparatus of the present invention includes a fluorescent tube 2, a ballast circuit 3 for lighting the fluorescent tube 2, a case 5 for housing the ballast circuit 3, and a holder 6 provided at the end of the case for holding the fluorescent tube 2. The ballast circuit 3 includes at least a first circuit board 8 and a second circuit board 9, and the second circuit board 8 is arranged to be substantially perpendicular to the first circuit board 9 in the case 5. This enables the effective utilization of space in the case 5 when the ballast circuit 3 is housed therein. Thus, even if the number of circuit elements is increased, the above configuration can suppress an increase in the size of the case 5, i.e., the lamp apparatus. Moreover, since the first and second circuit boards 8, 9 are substantially perpendicular to each other in the case, the heat-sensitive circuit elements can be separated from the fluorescent tube 2. Therefore, it is possible to suppress a rise in the temperature of those circuit elements by heat radiated from the fluorescent tube 2 and to prevent the lamp life from being shortened by thermal damage to the circuit elements.

The first circuit board 8 is arranged between the holder 6 and the second circuit board 9 so as to be substantially perpendicular to the central axis X of the case 5. Thus, the transfer of heat radiated from the fluorescent tube 2 can be cut by the first circuit board 8. Therefore, a rise in the temperature of space in the case 5 can be suppressed, so that thermal damage to the circuit elements by such a temperature rise can be prevented further.

The width of the second circuit board 9 is reduced in the direction opposite to the fluorescent tube 2. This can make full use of space in the case 5, thereby suppressing an increase in the size of the lamp apparatus.

In the above embodiment, the ballast circuit 3 has two circuit boards, i.e., the first circuit board 8 and the second circuit board 9. However, even if it has three or more circuit boards, the use of the above configuration can provide the similar effect.

Moreover, in the above embodiment, a bulb-shaped fluorescent lamp is taken as an example of a fluorescent lamp apparatus. However, the present invention can be applied to all the self-ballasted fluorescent lamps.

As described above, the present invention can provide a fluorescent lamp apparatus with longer lifetime that can suppress an increase in the size of the lamp apparatus and prevent thermal damage to circuit elements, even if the number of the circuit elements is increased significantly.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A fluorescent lamp apparatus comprising:

a fluorescent tube;

a ballast circuit for lighting the fluorescent tube;

a case for housing the ballast circuit; and a holder provided at an end of the case for holding the fluorescent tube, wherein the ballast circuit comprises at least a first circuit board and a second circuit board, a second circuit board is arranged to be substantially perpendicular to the first circuit board, and the first circuit board is arranged between the holder and the second circuit board so as to be substantially perpendicular to a central axis of the case.

2. The fluorescent lamp according to claim 1, wherein circuit elements that generate heat by electrical loss are mounted on the first circuit board, while circuit elements that are affected easily by heat are mounted on a surface of the second circuit board that does not face the circuit elements generating heat by electrical loss.

3. The fluorescent lamp apparatus according to claim 1, wherein the second circuit board is arranged so that a portion of its periphery comes into contact with the first circuit board.

4. The fluorescent lamp according to claim 1, wherein a width of the second circuit board is reduced in a direction opposite to the fluorescent tube.

5. The fluorescent lamp according to claim 1, wherein the second circuit board is displaced from the central axis of the case.

6. The fluorescent lamp according to claim 1, wherein circuit elements that generate heat by electrical loss are mounted on the first circuit board, while circuit elements that are affected easily by heat are mounted on a surface of the second circuit board that does not face the circuit elements generating heat by electrical loss.

* * * * *